US009681243B2

(12) United States Patent
Guo et al.

(10) Patent No.: US 9,681,243 B2
(45) Date of Patent: Jun. 13, 2017

(54) IN-PLANE OVERTRAVEL STOPS FOR MEMS MICROPHONE

(71) Applicant: Robert Bosch GmbH, Stuttgart (DE)

(72) Inventors: Zhijun Guo, Pittsburgh, PA (US);
Andrew J. Doller, Sharpsburg, PA (US)

(73) Assignee: Robert Bosch GmbH, Stuttgart (DE)

( * ) Notice: Subject to any disclaimer, the term of this patent is extended or adjusted under 35 U.S.C. 154(b) by 22 days.

(21) Appl. No.: 14/742,308

(22) Filed: Jun. 17, 2015

(65) Prior Publication Data

US 2016/0373874 A1    Dec. 22, 2016

(51) Int. Cl.
| | | |
|---|---|---|
| *H04R 25/00* | (2006.01) | |
| *H04R 31/00* | (2006.01) | |
| *B81B 3/00* | (2006.01) | |
| *H04R 7/20* | (2006.01) | |
| *H04R 7/26* | (2006.01) | |
| *H04R 19/00* | (2006.01) | |
| *H04R 19/04* | (2006.01) | |

(52) U.S. Cl.
CPC .......... *H04R 31/003* (2013.01); *B81B 3/0051* (2013.01); *H04R 7/20* (2013.01); *H04R 7/26* (2013.01); *H04R 19/005* (2013.01); *H04R 19/04* (2013.01); *H04R 31/00* (2013.01); *B81B 2201/0257* (2013.01); *H04R 2231/003* (2013.01)

(58) Field of Classification Search
None
See application file for complete search history.

(56) References Cited

U.S. PATENT DOCUMENTS

| | | | |
|---|---|---|---|
| 7,210,352 B2 | 5/2007 | Foster et | |
| 7,640,805 B2 | 1/2010 | Diamond et al. | |
| 8,186,220 B2 | 5/2012 | Geisberger | |
| 8,186,221 B2 | 5/2012 | Lin et al. | |
| 8,387,464 B2 | 3/2013 | McNeil et al. | |
| 8,625,823 B2* | 1/2014 | Buck ................... | H04R 19/005 381/174 |
| 8,692,340 B1 | 4/2014 | Ata et al. | |
| 8,921,957 B1* | 12/2014 | Zhang .................. | H04R 1/04 257/416 |
| 2006/0280319 A1 | 12/2006 | Want et al. | |

(Continued)

FOREIGN PATENT DOCUMENTS

| | | |
|---|---|---|
| EP | 2547121 | 1/2013 |
| WO | 2014/194316 | 12/2014 |
| WO | 2015/017979 | 2/2015 |

OTHER PUBLICATIONS

International Search Report and Written Opinion for Application No. PCT/EP2016/063013 dated Sep. 5, 2016 (11 pages).

*Primary Examiner* — Quoc D Tran
(74) *Attorney, Agent, or Firm* — Michael Best & Friedrich LLP (57) ABSTRACT

A MEMS microphone including a plurality of overtravel stops (OTS) connected to a perimeter of a membrane of the MEMS microphone. The OTS are released from a backplate layer during manufacturing and are configured to contact the backplate to restrict movement of the OTS and thus restrict movement of the membrane of the MEMS microphone. Embodiments of the invention provide, in particular, an overtravel stop that limits movement of the membrane in a radial direction.

12 Claims, 7 Drawing Sheets

(56) References Cited

U.S. PATENT DOCUMENTS

| | | | |
|---|---|---|---|
| 2008/0123876 A1* | 5/2008 | Sato | H04R 19/016 381/174 |
| 2011/0121413 A1* | 5/2011 | Allen | B81B 7/0041 257/416 |
| 2013/0001550 A1 | 1/2013 | Seeger et al. | |
| 2013/0016859 A1* | 1/2013 | Buck | H04R 19/005 381/174 |
| 2014/0084394 A1 | 3/2014 | Je | |

* cited by examiner

IN-PLANE OVERTRAVEL STOPS FOR MEMS MICROPHONE

BACKGROUND

Embodiments of the invention relate to microelectricalmechanical (MEMS) microphones and methods of their construction. In particular, embodiments of the invention relate to constructions of overtravel stops for a MEMS microphone membrane.

Capacitive MEMS microphones are mechanically sensitive devices. They operate over a wide input dynamic range, for example, 60-130 dB SPL. A membrane that is sensitive enough to detect the lowest pressures (e.g., 1 mPa) must withstand larger pressure fluctuations. Large pressure fluctuations may occur due to, for example, impacts, vibration, vacuum, over pressure, and acoustic pulses due to air discharge near the port hole. The membrane must withstand pressures in the range of several 10 s of Pascals without being destroyed. This is typically achieved by adapting the membrane to contact overtravel stops (OTS) to prevent excessive movement in a direction of applied acoustic pressure. However, these designs may not provide overtravel protection for the membrane in other directions.

SUMMARY

Embodiments of the invention provide for various constructions of overtravel stops that are configured to restrict movement of the membrane of the microelectricalmechanical (MEMS) microphone in multiple directions. In particular, the overtravel stops restrict movement of the membrane in a radial direction with respect to the membrane. The overtravel stops are located on a backplate layer of the MEMS microphone. During manufacturing of the MEMS microphone, the overtravel stops are separated from the backplate layer with a precise gap between the backplate layer and the overtravel stop. The gap allows for a predetermined range of movement of the overtravel stop before it contacts a backplate. In addition, the overtravel stop is mechanically connected to the membrane of the MEMS microphone. Therefore, movement of the membrane is also restricted by the range of movement of the overtravel stop. In this way, the overtravel stop provides a structure that protects the membrane from damage caused by overtravel.

In one embodiment, a MEMS microphone is provided. The MEMS microphone has a first layer including a membrane, a spring having a first end coupled to the membrane and a second end coupled to a support, and a second layer. The second layer includes a backplate connected to the support and an overtravel stop released from the backplate. The overtravel stop is physically separated from the backplate and is configured to restrict a range of movement of the membrane in multiple directions by contacting the backplate.

In another embodiment, a method of limiting the movement of a MEMS membrane is provided. The method includes forming the membrane and a spring, coupling an end of the spring to a support, and coupling the support to the backplate. An overtravel stop structure is released from the backplate and physically separated from the backplate by a gap. The overtravel stop structure is coupled to the membrane and is configured to restrict movement of the membrane in multiple directions by contacting the backplate.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

A MEMS microphone is designed to convert acoustic pressure into an electrical signal. The MEMS microphone senses the acoustic pressure with a movable membrane connected with springs within a MEMS microphone die. The membrane is biased with a voltage. When the membrane moves relative to a backplate, capacitance between the membrane and the backplate varies in proportion to the amount of movement. The MEMS microphone generates the electrical signal based on the capacitive changes and thus varies the electrical signal based on the intensity of the acoustic pressure received at a membrane.

Based on the acoustic pressure, the membrane experiences acceleration in an axial direction (i.e., the direction of applied acoustic pressure). If the acoustic pressure is large enough, the acceleration may exceed the restorative force of the springs. In this case, the MEMS microphone may be damaged. In addition, external movements and impacts can result in excessive acceleration of the membrane in multiple directions. For example, dropping the MEMS microphone against a hard surface may result in a rapid acceleration on impact. Equipping the MEMS microphone with a plurality of overtravel stops (OTS), as disclosed herein, helps protect the membrane from excessive acceleration. The OTS helps prevent the membrane from travelling out of a safe range of movement in multiple directions.

Figure 1:
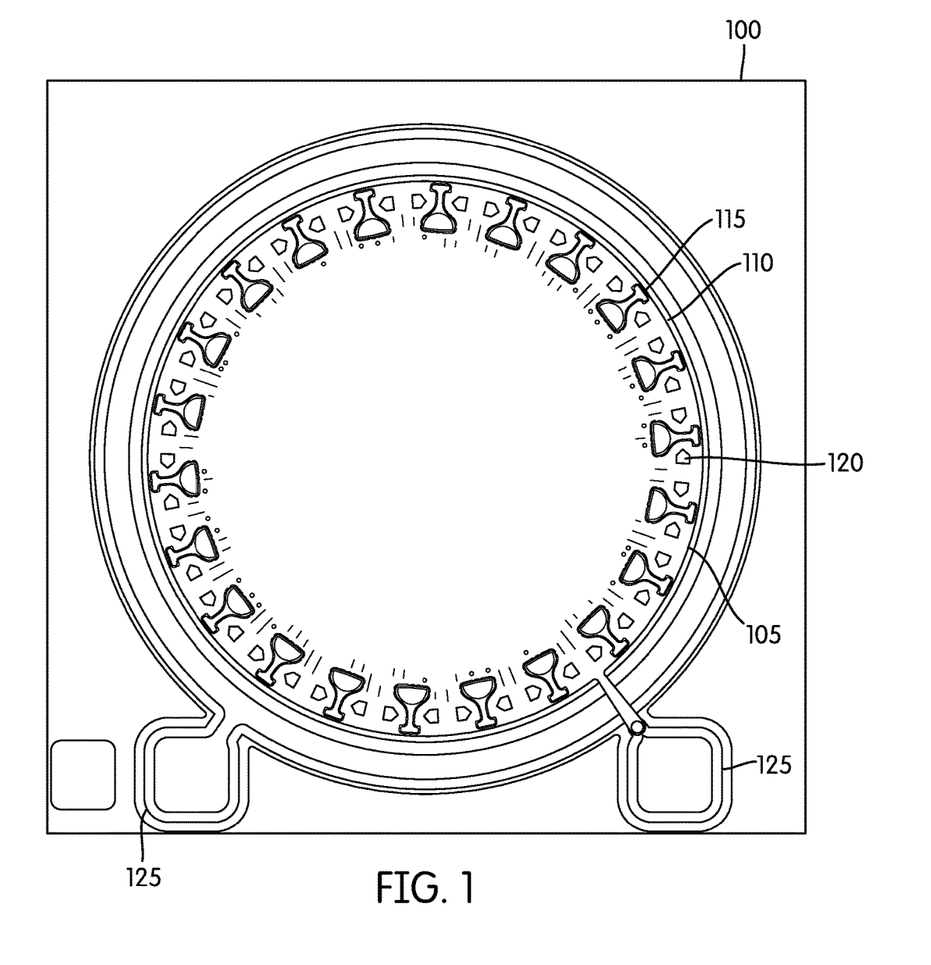
FIG. 1 is an illustration of an embodiment of a MEMS microphone including a plurality of overtravel stops positioned around a perimeter of a membrane of the MEMS microphone.

FIG. 1 illustrates an internal view of a MEMS microphone 100. The MEMS microphone 100 includes a membrane 105, a backplate 110, and a plurality of overtravel stops (OTS 115). In the exemplary illustration, the membrane 105 is positioned below the backplate 110 and visible through the backplate 110. The membrane 105 is a movable structure (e.g., a diaphragm) within the MEMS microphone 100. An oxide anchor 120 is physically attached to the backplate 110, which is a rigid structure. In addition, the oxide anchor 120 is physically attached to the membrane 105. Thus, the oxide anchor 120 provides a mechanical connection point between the membrane 105 and the backplate 110. The oxide anchor 120 is formed of a nonconductive metal oxide that also provides electrical isolation between the membrane 105 and the backplate 110. Due to the electrical isolation, the membrane can be biased at a different potential than the backplate 110. Also illustrated in FIG. 1 are electrical connection pads 125. The electrical connection pads 125 provide a source of electrical potential for both the backplate 110 and the membrane 105.

Figure 2:
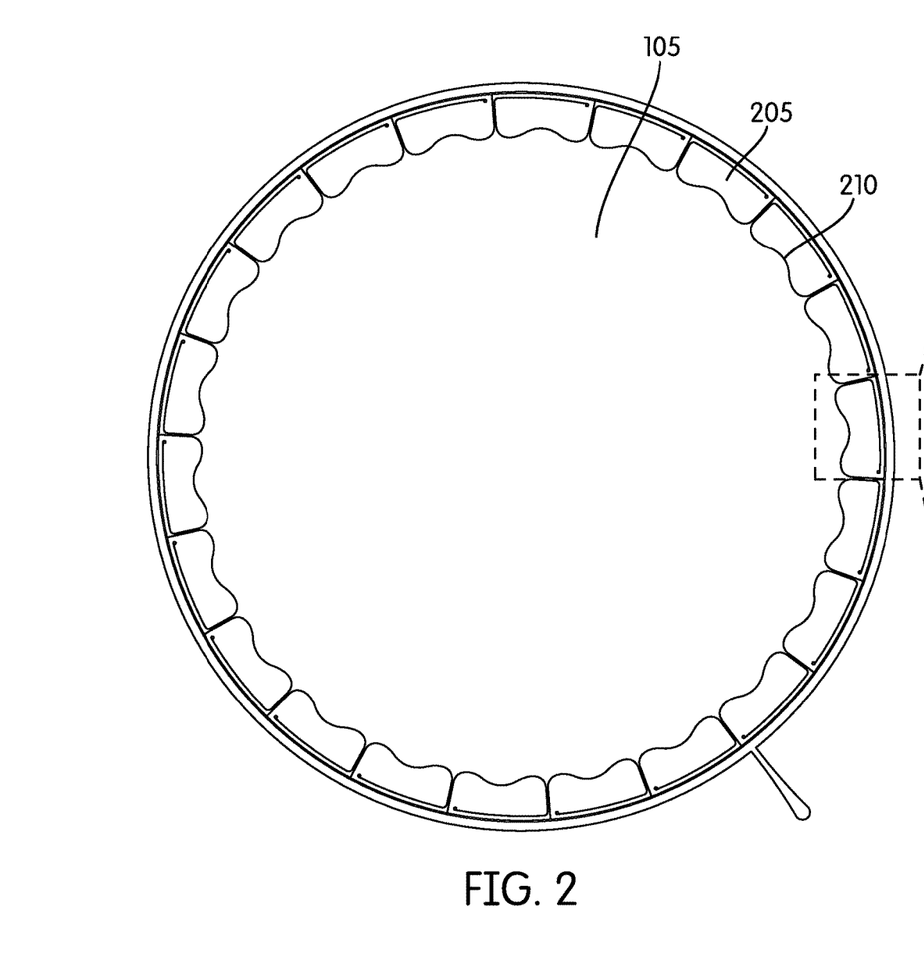
FIG. 2 is an illustration of the membrane of the MEMS microphone of FIG. 1.
Figure 3:
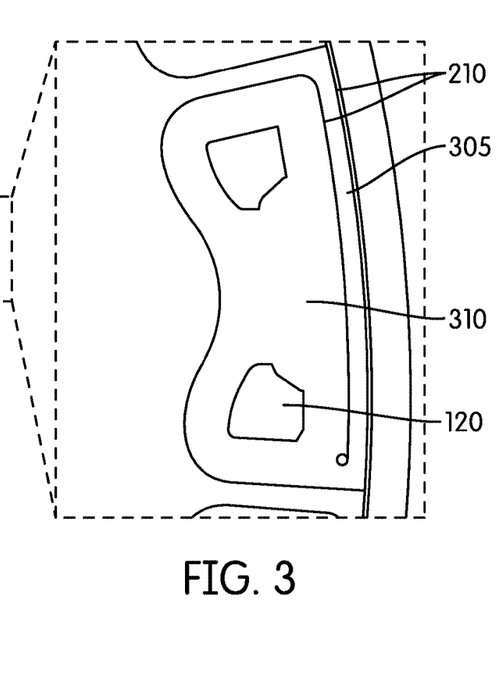
FIG. 3 is an illustration of a spring of the MEMS microphone of FIG. 1.

FIG. 2 illustrates the membrane 105. The membrane 105 is made of a contiguous layer of material that allows flexibility in an axial direction. On the perimeter of the membrane 105 are a plurality of springs 205 that are formed out of the membrane 105 by creating thin slits 210 between portions of the membrane 105. FIG. 3 is a detailed view of one of the plurality of springs 205 on the perimeter of the membrane 105. Each of the springs 205 includes a thin beam 305 of material between the thin slits 210 that extends along the perimeter of the membrane 105 and to a surface 310. The surface 310 attaches to the oxide anchor 120. The surface 310 is fixed relative to the backplate 110. The thin beam 305 allows the membrane 105 to flex relative to the surface 310.

Figure 4:
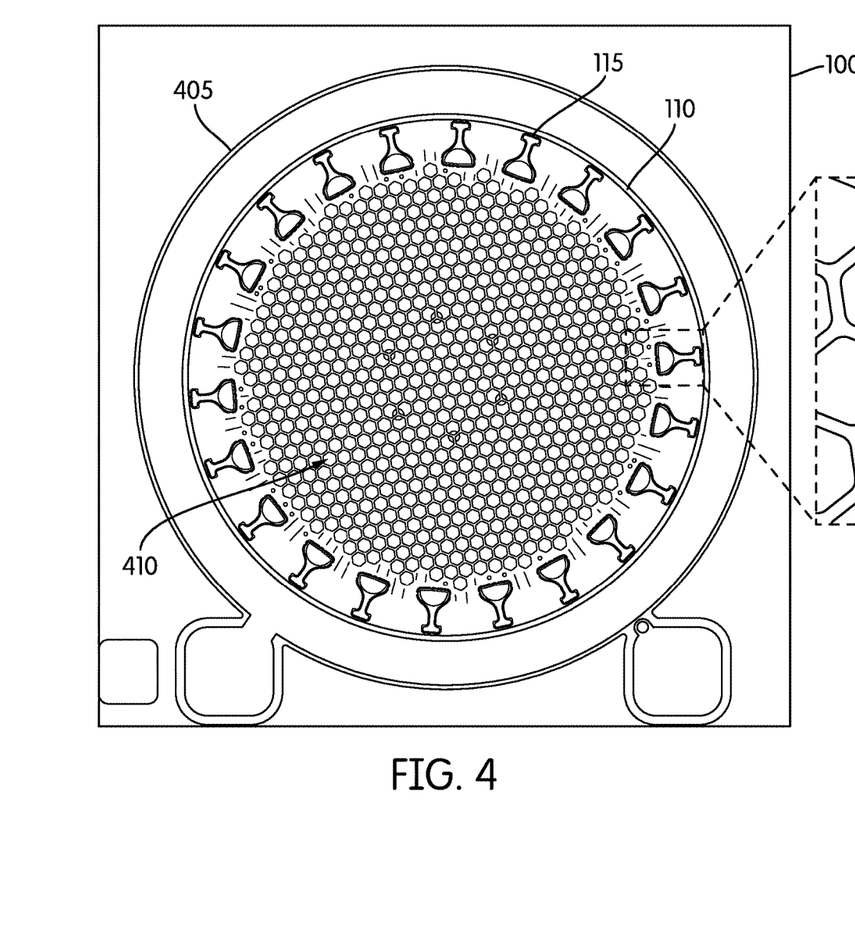
FIG. 4 is an illustration of a backplate layer including a backplate and the plurality of overtravel stops of FIG. 1.

FIG. 4 illustrates an embodiment of a backplate layer 405. The backplate layer 405 includes the backplate 110 and the OTS 115. The backplate 110 includes a honeycomb surface 410 that allows acoustic pressure to enter the MEMS microphone 100. In such an embodiment, twenty-two OTS 115 are positioned along the perimeter of the backplate 110. The OTS 115 are released from the backplate layer 405 during the manufacturing process. It should be noted that in some embodiments there are more or less OTS 115.

Figure 5:
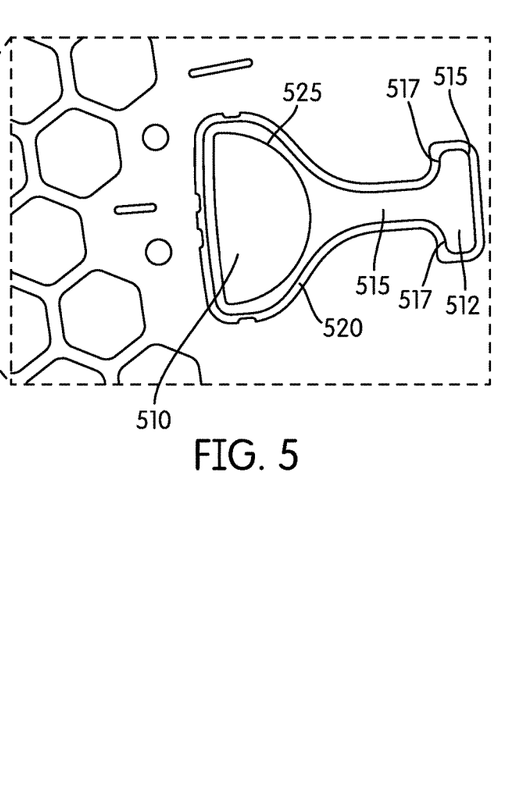
FIG. 5 is a detailed view of one of the overtravel stops of FIG. 1.

FIG. 5 illustrates a detailed view of an embodiment of a single OTS 515. The OTS 515 has a first end 510 orientated proximal to the membrane 105 and a second end 512 orientated distal to the membrane 105. The first end 510 and the second end 512 are connected by a portion of the OTS 515. In this embodiment, the second end 512 flares outward as compared to the first end 510 thus resulting in a roughly bottle-shaped or vase-shaped OTS 515. The second end 512 has an arch-shaped stop 517 on each side of the second end 512 that provide contact points with the backplate layer 405. Each arch-shaped stop 517 is roughly perpendicular to a radial direction of the membrane 105.

The OTS 515 is physically separated from the backplate layer 405 by etching or otherwise removing material from the backplate layer 405 surrounding the OTS 515. The separation is illustrated as a gap 520. The gap 520 is generally a straight cut thus forming the OTS 515 with flat sides. The gap 520 sets a predetermined distance that the OTS 515 may travel before the OTS 515 restricts movement of the membrane 105. A connection point 525 physically attaches a bottom side of the first end 510 of the OTS 515 with the membrane 105. It should be noted that the OTS 515 may have alternative shapes.

Figure 6:
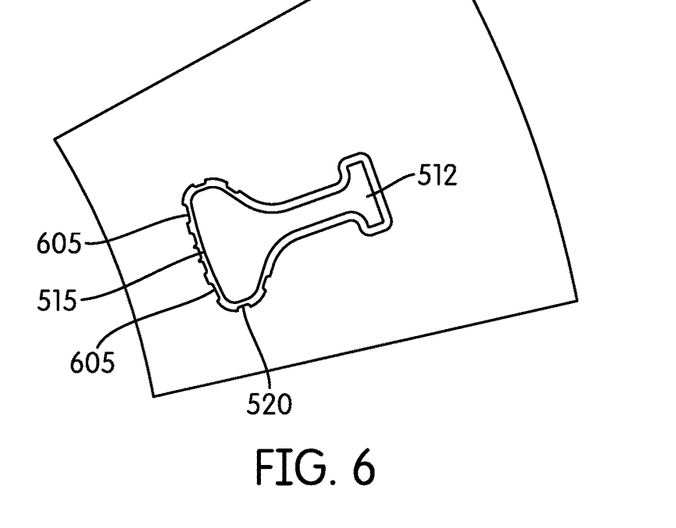
FIG. 6 is a detailed view of one of the overtravel stops and backplate of FIG. 1.

FIG. 6 illustrates an embodiment of the OTS 515 positioned on the backplate layer 405. As illustrated, the gap 520 provides a small clearance between the OTS 515 and the backplate layer 405. The gap 520 is formed by cutting through the backplate layer 405 that effectively isolates a portion of the backplate layer 405 to form the OTS 515.

When the membrane 105 is actuated by acoustic pressure, the gap 520 provides clearance for movement of the OTS 515 and the membrane 105. However, once the membrane 105 reaches its maximum deflection, the OTS 515 contacts the backplate layer 405. Since the OTS 515 is connected to the membrane 105 via the connection point 525 the membrane 105 is prevented from excessive deflection (i.e., overtravel). In particular, the second end 512 of the OTS 515 is configured to contact the backplate layer 405 when the movement of the membrane 105 has reached its safe maximum displacement. However, it should be noted that the OTS 515 may contact the backplate layer 405 at a plurality of contact points 605 including at the first end 510 of the OTS 515 or along the sides of the OTS 515. The contact points 605 provide structural and radial support for the OTS 515. Additionally, the contact points 605 may provide support in other directions. For example, the contact points 605 may restrict movement of the OTS 515 in a circumferential direction. By restricting movement of the OTS 515, the membrane 105 is also restricted in its movement range. In particular, acoustic pressure imparts force in an axial direction of the membrane 105. This force in the axial direction causes some radial movement of the OTS 515. This is because the membrane 105 pulls on the OTS 515 toward the center of the membrane 105 as the membrane 105 extends in either axial direction.

Figure 7:
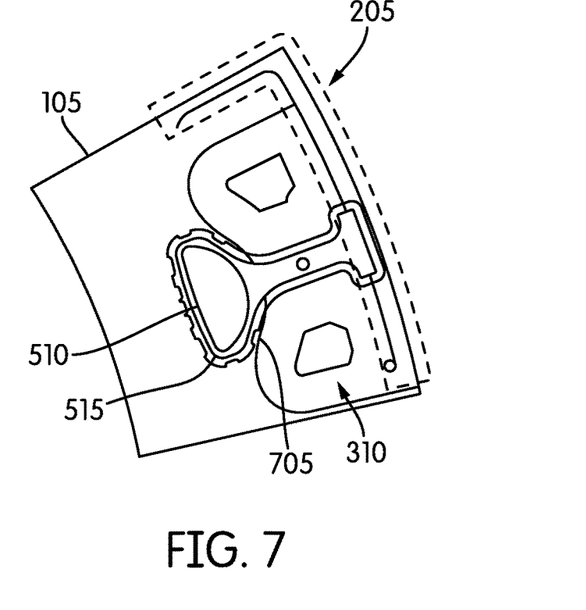
FIG. 7 is an illustration of one of the overtravel stops and a spring of the membrane of FIG. 1.

FIG. 7 illustrates an embodiment of an exemplary position of the OTS 515 relative to the membrane 105. The OTS 515 is positioned along an inside curve 605 of the perimeter of the membrane 105. The OTS 515 is affixed to the membrane 105 at the connection point 525. Other than the connection point 525, the OTS 515 is detached and positioned above the membrane 105, the springs 205, and the surface 310. The OTS 515, even though formed on the same layer as the backplate 110, the OTS 515 is physically separate and mechanically isolated from the backplate 110.

Figure 8:
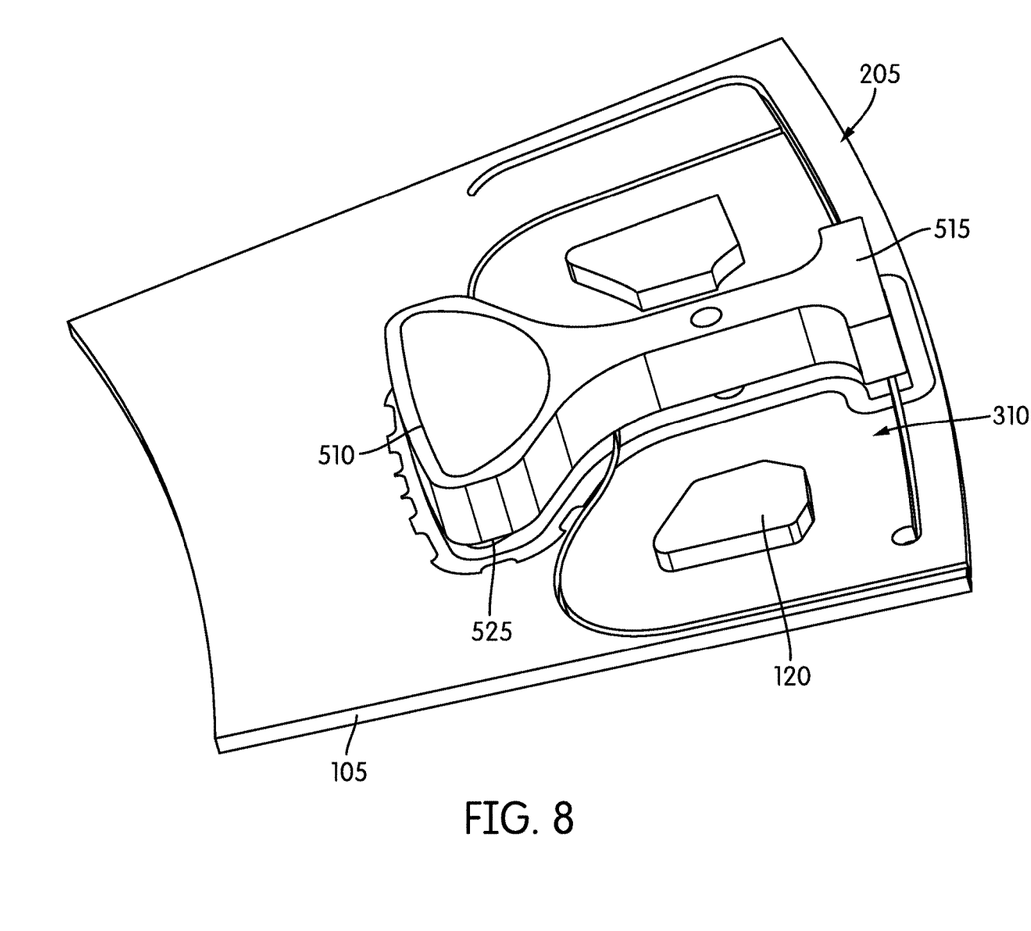
FIG. 8 is a perspective view of the overtravel stop of FIG. 1.

FIG. 8 illustrates a perspective view of the OTS 515. In order to illustrate the relationship of the OTS 515 with the membrane 105, the OTS 515 is illustrated with the backplate layer 405 removed. As illustrated, the membrane 105 is positioned under the OTS 515 and connected to the connection point 525 of the first end 510 of the OTS 515. The oxide anchor 120 provides a thin connection point between the backplate layer 405 and the surface 310. As a consequence, the membrane 105 is connected via the spring 205 to the oxide anchor 120, and the oxide anchor 120 is connected to the backplate 410. As illustrated, the backplate 410 is connected at a top of the oxide anchor 120 such that the backplate layer 405 surrounds the OTS 515. As the OTS 515 is formed from the backplate layer 405, the OTS 515 has the same thickness as the backplate layer 405.

Figure 9:
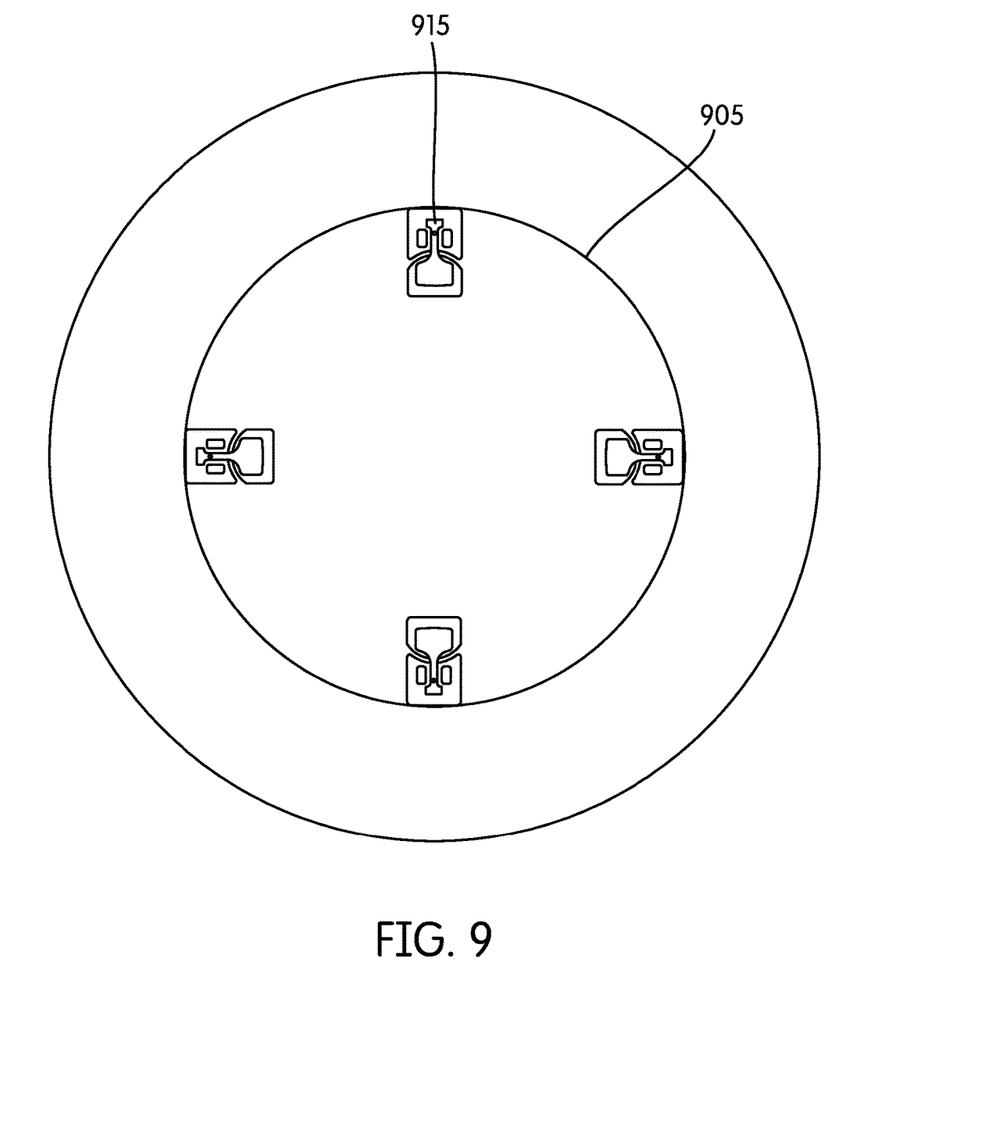
FIG. 9 is another embodiment of a MEMS microphone including 4 overtravel stops.
Figure 10:
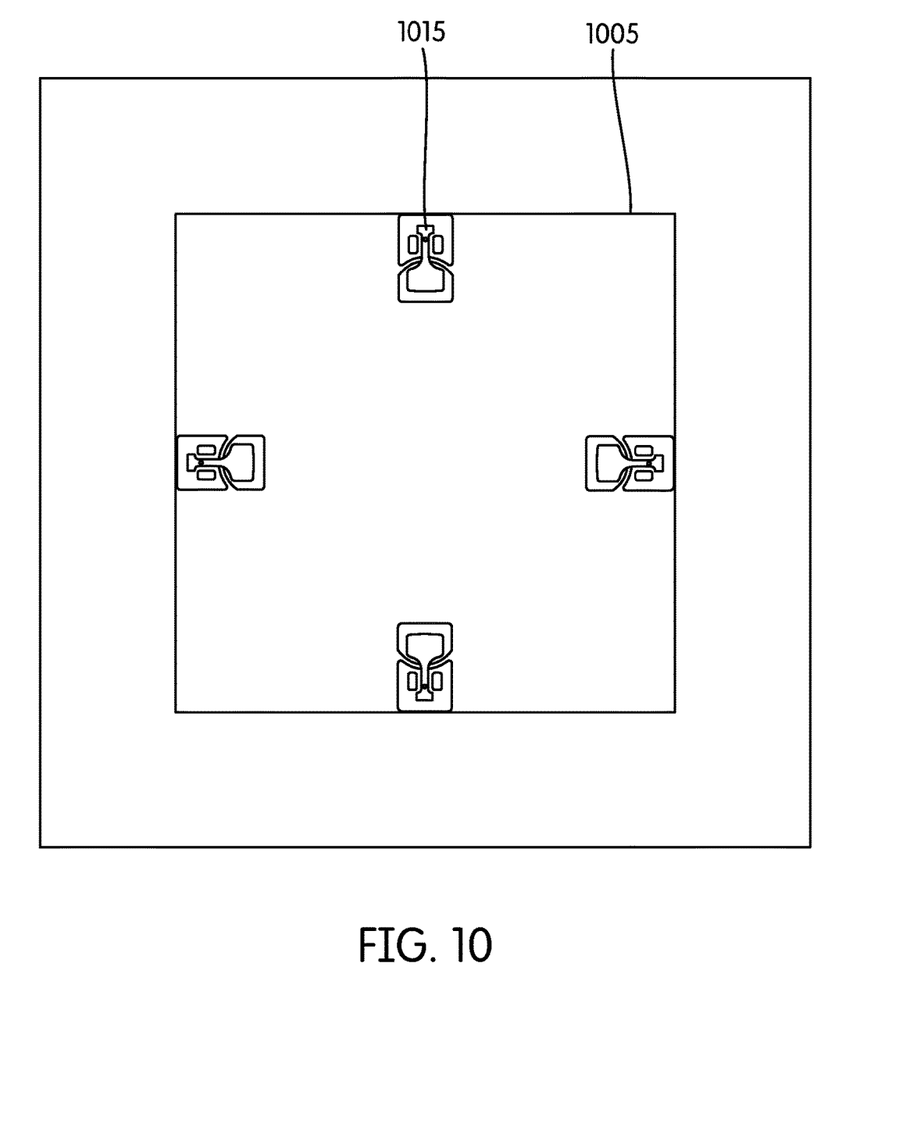
FIG. 10 is yet another embodiment of a MEMS microphone including a noncircular membrane.

FIG. 9 illustrates another embodiment of the MEMS microphone 100. In the exemplary illustration, four OTS 915 are positioned around the perimeter of the membrane 905. It should be noted that the number of OTS 915 may vary with each implementation. However, increasing the number of OTS 915 tends to provide more uniform support for the membrane 905. Another embodiment is illustrated in FIG. 10. Such an embodiment includes a non-circular membrane 1005 and OTS 1015. In the particular example, the membrane 1005 is square-shaped. Various other membrane shapes and styles are possible without departing from the spirit of the invention.

Thus, the invention provides, among other things, a MEMS microphone 100 with a plurality of OTS 515 located on a backplate layer 405. The OTS 515 are configured to restrict movement of the membrane 105 in multiple directions including in the radial direction of the membrane. Each of the OTS 515 provides contact points 605 that contact the backplate 110 when the membrane has reached its maximum safe deflection. Various features and advantages of the invention are set forth in the following claims.

What is claimed is:

1. A microelectricalmechanical (MEMS) microphone comprising:
   a first layer including
      a membrane, and
      a spring having
         a first end coupled to the membrane, and
         a second end coupled to a support; and
   a second layer including
      a backplate connected to the support, and
      an overtravel stop released from the backplate such that the overtravel stop is physically separated from the backplate by a gap in a radial direction, the overtravel stop being configured to restrict a range of movement of the membrane in multiple directions by contacting the backplate, the overtravel stop having
         a first end orientated proximal to the membrane, and
         a second end orientated distal to the membrane and flaring outward to restrict movement of the membrane in the radial direction.

2. The MEMS microphone of claim 1, wherein the second end is shaped such that a flared portion of the second end is configured to restrict movement of the membrane in an inward radial direction by contacting the backplate.

3. The MEMS microphone of claim 1, wherein the second end has an arch-shaped stop on each side of the second end, the arch-shaped stop being perpendicular to a radial direction of the membrane.

4. The MEMS microphone of claim 3, wherein the arch-shaped stop contacts the backplate when the membrane has reached a maximum deflection.

5. The MEMS microphone of claim 1, wherein the first end is connected to the membrane.

6. The MEMS microphone of claim 1, wherein the overtravel stop is located along a perimeter of the membrane.

7. The MEMS microphone of claim 1, further comprising a plurality of overtravel stops located along a perimeter of the membrane.

8. The MEMS microphone of claim 1, wherein the membrane is connected via the spring to an oxide anchor and the oxide anchor is connected to the backplate.

9. A method of limiting movement of a membrane, the method comprising:
   forming the membrane and a spring;
   coupling an end of the spring to a support;
   coupling the support to a backplate;
   releasing an overtravel stop structure from the backplate such that overtravel stop structure is physically separated from the backplate by a gap in a radial direction; and
   coupling the overtravel stop structure to the membrane, the overtravel stop structure configured to restrict movement of the membrane in multiple directions by contacting the backplate, the overtravel stop having a first end oriented proximal to the membrane and a second end oriented distal to the membrane and flaring outward to restrict movement of the membrane in the radial direction.

10. The method of claim 9, further comprising processing a first layer, the processing including forming a plurality of slits in the membrane to form the spring from the membrane.

11. The method of claim 10, further comprising processing a second layer, the processing including forming an overtravel stop by cutting through a backplate layer to isolate a portion of the backplate layer that is the overtravel stop.

12. A MEMS device, the MEMS device comprising:
   a movable structure;
   a plurality of springs, each of the plurality of springs having a first end coupled to the movable structure and each of the plurality of springs having a second end connected to a support; and
   a first layer including
      a rigid structure connected to the support, and
      an overtravel stop released from the rigid structure such that the overtravel stop is physically separated from the rigid structure by a gap in a radial direction, the overtravel stop coupled to the movable structure, the overtravel stop having
         a first end oriented proximal to the movable structure, and
         a second end oriented distal to the movable structure and flaring outward to stop movement of the movable structure by contacting the rigid structure after the movable structure has moved a predetermined distance in the radial direction.

* * * * *